United States Patent [19]

Huber et al.

[11] Patent Number: 5,047,355

[45] Date of Patent: Sep. 10, 1991

[54] SEMICONDUCTOR DIODE AND METHOD FOR MAKING IT

[75] Inventors: Jakob Huber, Beyharting; Ewald Pettenpaul, Unterhaching, both of Fed. Rep. of Germany

[73] Assignee: Siemens Aktiengesellschaft, Berlin and Munich, Fed. Rep. of Germany

[21] Appl. No.: 406,826

[22] Filed: Sep. 12, 1989

Related U.S. Application Data

[63] Continuation of Ser. No. 170,614, Mar. 11, 1988, abandoned, which is a continuation of Ser. No. 637,189, Aug. 2, 1984, abandoned.

[30] Foreign Application Priority Data

Sep. 21, 1983 [DE] Fed. Rep. of Germany ....... 3334167

[51] Int. Cl.$^5$ .............................................. H01L 21/04
[52] U.S. Cl. ........................................ 437/15; 437/84; 437/228; 437/234; 437/904
[58] Field of Search ................. 437/84, 228, 234, 904, 437/15

[56] References Cited

U.S. PATENT DOCUMENTS

| | | | |
|---|---|---|---|
| 2,790,037 | 4/1957 | Shockley | 357/58 |
| 3,184,350 | 5/1965 | Marinace | 437/84 |
| 3,270,231 | 8/1966 | Loebner | 357/58 |
| 3,442,011 | 5/1969 | Strieter | 437/84 |
| 3,445,686 | 5/1969 | Rutz | 357/58 |
| 3,532,562 | 10/1970 | Clawson | 437/184 |
| 3,652,324 | 3/1972 | Chu et al. | 437/244 |
| 3,749,614 | 7/1973 | Boleky, III et al. | 437/84 |
| 3,769,694 | 11/1973 | Collins et al. | 437/184 |
| 4,173,763 | 11/1979 | Chang et al. | 357/12 |
| 4,198,644 | 4/1980 | Esaki | 357/12 |
| 4,252,580 | 2/1981 | Messick | 357/58 |
| 4,261,004 | 4/1981 | Masuhara et al. | 357/23.13 |
| 4,263,057 | 4/1981 | Ipri | 357/23.9 |
| 4,268,844 | 5/1981 | Meiners | 357/58 |
| 4,277,883 | 7/1981 | Kaplan | 437/84 |
| 4,286,275 | 8/1981 | Heiblum | 357/12 |
| 4,339,285 | 7/1982 | Pankove | 357/58 |
| 4,371,884 | 2/1983 | Esaki et al. | 357/12 |
| 4,396,931 | 8/1983 | Dumke et al. | 357/12 |
| 4,468,851 | 9/1984 | Wieder et al. | 357/16 |
| 4,494,016 | 1/1985 | Ransom et al. | 357/22 H |
| 4,504,840 | 3/1985 | Chappell et al. | 357/12 |
| 4,527,213 | 7/1985 | Ariizumi | 357/23.13 |
| 4,546,366 | 10/1985 | Buchanan | 357/58 |
| 4,556,896 | 12/1985 | Ohata | 357/16 |
| 4,581,621 | 4/1986 | Reed | 357/12 |
| 4,583,105 | 4/1986 | Rosenberg | 357/23.2 |
| 4,593,301 | 6/1986 | Inata et al. | 357/58 |

FOREIGN PATENT DOCUMENTS

| | | |
|---|---|---|
| 0003130 | 1/1979 | European Pat. Off. |
| 2030175 | 10/1970 | France |
| 2337424 | 7/1977 | France ................ 357/58 |

OTHER PUBLICATIONS

Lemay, "Manufacture of Semiconductor Devices", IBM TD13, vol. 5, No. 2, Jul. 1962, p. 17.
Ghandhi, S. K., VLSI Fabrication Principles, Silicon and Gallium Arsenide, John Wiley & Sons, Inc. (1983), p. 300, $\pi 2$, p. 301, $\pi 2$.
IEEE Journal of Solid-State Circuits, vol. SC-17, No. 4, Aug. 1982, pp. 648 to 653, Nambu et al.
"Semiconductor and Electronic Devices 2nd Edition", by A. Bar-Lev, pp. 136 to 145.
"pn-Übergänge", by Ihre Physik, New York/1979, 9 pages.
"Punch-Through Gate Protection of M.O.S. Devices", by Miller et al.

Primary Examiner—Brian E. Hearn
Assistant Examiner—Gordon V. Hugo

[57] ABSTRACT

A semiconductor diode has three adjacent regions. The doped regions are doped in the same manner and are separated from one another by a third, intrinsic region. The intrinsic region is dimensioned such that upon application of a specific external voltage at the operating temperature of the diode, it is possible for charge carriers to tunnel from one doped region to the other doped region through the intrinsic region. The semiconductor diode has a planar structure on a semiconductor substrate. A semconductor diode of this kind is suitable for use as a protective diode for other components, particularly when they are mounted on substrates consisting fo connecting semiconductors.

2 Claims, 2 Drawing Sheets

SEMICONDUCTOR DIODE AND METHOD FOR MAKING IT

CROSS-REFERENCE TO A RELATED APPLICATION

This is a continuation of Ser. No. 07/170,614 filed Mar. 11, 1988, now abandoned, which is a continuation of Ser. No. 06/637,189 filed 8/2/84, abandoned.

BACKGROUND OF THE INVENTION

The invention concerns a semiconductor diode having three adjacent regions: two that are doped in the same manner, and a third that is doped oppositely from the other two regions and that separates them. The two regions that are doped in the same manner have ohmic contacts.

A semiconductor diode of this kind has an NPN or PNP structure consisting of three adjacent semiconductor layers with ohmic contacts. To reduce the energy barriers, the width of the middle layer in the three layer structure is made thin enough so that even without external voltage being applied to the electrodes, with the given doping of this layer, the entire area of this layer is depleted of free charge carriers. Diodes of the n+p or p+n type can be adapted only with difficulty, if at all, for use as protective diodes for gallium arsenide components, the more so as for this purpose high p-dopings would have to be introduced in gallium arsenide, which is known to be difficult or impossible. On the other hand, gallium arsenide components that are manufactured on semi-insulating substrates are very sensitive to static discharge. For this reason, no protective diodes made of connecting semiconductors have been installed on semi-insulating substrates. Due to the sensitivity of gallium arsenide components to static discharges and to the fact that components of this kind are designed primarily as planar components on a semi-insulating substrate, a concept for manufacturing planar protective diodes for gallium arsenide components on semi-insulated substrates would be of particular importance.

It is therefore one purpose of this invention to provide a semiconductor diode that is suited for use as a planar diode on semi-insulating substrates as well as other ones, and which has an arbitrarily small threshold voltage, so that it can be used, for example, as a protective diode for other semiconductor components located on the substrate.

SUMMARY OF THE INVENTION

This is achieved for a diode of the kind described above by having the third of center region that has an intrinsic conductivty, and by dimensioning the intrinsic region such that upon the application of a specific external voltage at the operating temperature of the diode it is possible for charge carriers to tunnel from one doped region to the other one through third region and that the three regions have a planar structure that is formed on a semiconductor substrate.

Such a diode offers, in an advantageous manner, the ability of manufacturing protective diodes for gallium arsenide components mounted on semi-insulating substrates, and to accomplish this at relatively low cost and with conventional, technically tested processes.

The semiconductor substrate may be made of a semi-insulating material, for example, of a binary, ternary or guaternary compound semiconductor, in particular, of gallium arsenide, indium phosphide or gallium aluminum arsenide.

Diodes in accordance with the invention may be manufactured easily and at low expense on substrates of this kind. Similar diodes previously known to—for example, NPN diodes—cannot practically be manufactured, particularly on substrates consisting of compound semiconductors, since the high P concentrations of approximately $10^{20}$ dope atoms per $cm^3$ cannot be successfully manufactured for this purpose. In the case of very high dopings of compound semiconductors, it can happen, on the one hand, that the crystal structure is so severely damaged that the effect to be achieved does not take place, or, due to the amphoteric character of doping agents in compound semiconductors, the result achieved has an opposite effect.

The two doped regions that are doped in the same manner may have an n-doping. In conventional compound semiconductors, n-dopings are easier to manufacture than p-dopings. In certain cases, it may also be advantageous for the two doped regions that are doped in the same manner to have a p-doping.

For many applications it is advantageous for the two doped regions that are doped in the same manner to have the same doping concentration. In certain applications, however, it is advantageous for the two doped regions that are doped in the same manner to have different doping concentrations.

For certain applications, it is advantageous to have at least one of the two doped regions be made out of some other material than that used for the intrinsic region. There are also applications in which it is advantageous to have at least one of the three regions be made out of a semiconductor material other than that used for the semiconductor substrate.

For many applications, the invention takes the particularly advantageous form wherein the semiconductor diode is mounted with at least one other semiconductor element on the same semiconductpr substrate and is, for example, a protective diode.

For the manufacture of semiconductor diodes in accordance with the invention, it is advantageous if a semiconductor substrate is provided with at least two separated doped regions that are doped in the same manner, in such a way that an intermediate region between the two doped regions remains free of dopant, that the intermediate region, in the event that it no longer has an intrinsic conductivity is made to have an intrinsic conductivity that ohmic contacts are deposited on the doped regions, that the contacts are alloyed and that passivation of the entire surface takes place.

For certain applications it is desirable to have the doped regions introduced by means of implanatation and subsequent annealing. In other applications, on the other hand, it is advantageous to have the doped regions applied to an intrinsic semiconductor substrate by means of a doped semiconductor layer that is epitaxially applied to the entire surface, and after that to have the epitaxially applied semiconductor layer structured by photolithographic processes in such a manner that at the places for which the doped regions are planned, the doped, epitaxially deposited semiconductor layer is retained, while at the places at which intrinsic regions are planned, the dooed, epitaxially deposited semiconductor layer is fully removed, as far as the intrinsic substrate.

The doped regions may also be applied, by means of epitaxy or implantation, to an intrinsic semiconductor substrate and the center region may be generated by an insulation-implanatation of, for example, oxygen or hydrogen ions.

BRIEF DESCRIPTION OF THE DRAWINGS

Exemplary and non-limiting preferred embodiments of the invention are shown in the drawings in which.

DETAILED DESCRIPTION OF THE PREFERRED EMBODIMENTS

Figure 1:
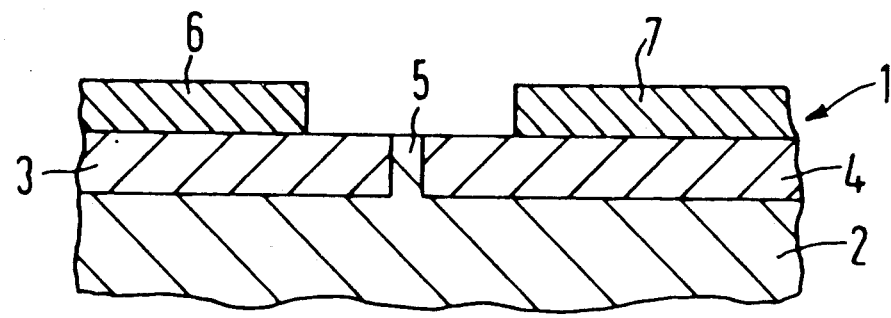
FIGS. 1 and 2 show an embodiment of the invention in cross-section and top view, respectively.

FIG. 1 shows an embodiment of a semiconductor diode 1 according to the invention. On a semiconductor substrate 2, which may be semi-insulating and may be made of binary, ternary or guaternary compound semiconductors, in particular of gallium arsenide, indium phosphide or gallium aluminum arsenide, are placed two doped regions 3, 4, which are doped in the same manner, in particular with an n-doping. Between the two doped regions 3 and 4 third or an center region 5. The center region 5 is either intrinsic from the outset, as an intermediate region between the doped regions 3 and 4, in the event that the semiconductor substrate 2 is intrinsic, or else, if the semiconductor substrate 2 is not intrinsic, the region 5 is made intrinsic. On the doped regions 3 and 4 are mounted ohmic contacts 6 and 7, preferably on a germanium-gold base. For example, there can be introduced in seguence on the doped regions 3 and 4 a series of layers including of germanium, gold, chromium and gold or a series of layers including of germanium, gold, nickel and gold.

Figure 2:
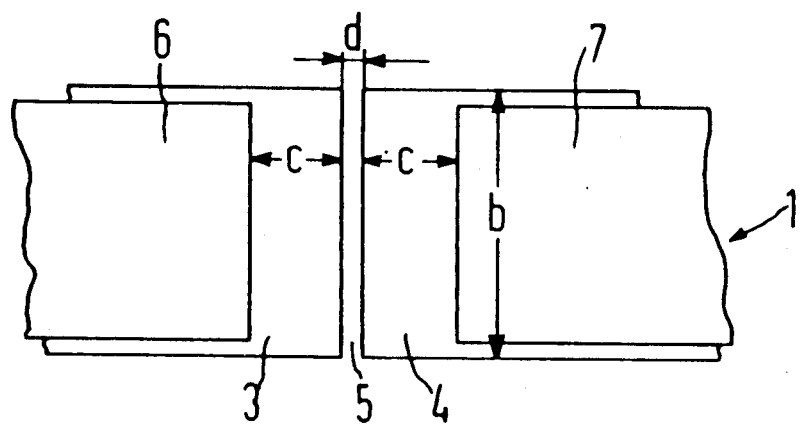

FIG. 2 shows a top view of a semiconductor diode in accordance with FIG. 1. Identical elements are marked with the same reference numbers and are not described again. In addition, dimension d designates the length of the diode, in other words, the width of the gap covered by the intrinsic region 5, and dimension c designates the distance between the intrinsic region 5 and the ohmic contacts 6, 7 mounted on the doped regions 3 and 4. Dimension b represents the width of the diode, i.e. the extension of the doped regions 3, 4 parallel to the long edge of the region 5.

For a particular embodiment with a substrate of gallium arsenide (GaAs) and n-doped regions 3, 4 with the same doping concentration, which are doped with silicon in a concentration of about $3 \times 10^{17}$ cm$^{-3}$ and with ohmic contacts of the composition germanium, gold, chromium, gold (Ge, Au, Cr, Au), the following dimensions were selected: b=80 microns c=1.5 microns and d=1.5 microns.

Figure 3:
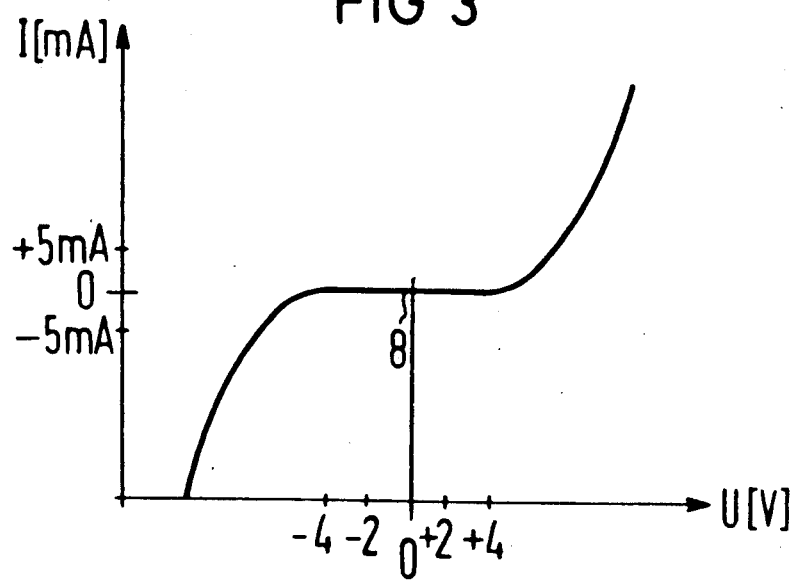
FIG. 3 shows a current-voltage curve for the embodiment of FIGS. 1 and 2.

FIG. 3 shows the current-voltage curve of the special embodiment shown in FIG. 2 for a semiconductor diode 1. For the specially selected dimensions b, c, d and the specially selected materials, as may be seen from the curve 8, the current I is zero through the diode 1 in the voltage range between about $-2.5$ V to $+2.5$ V. On the other hand, for stronger voltages, either negative or positive, the current changes sharply, which is attributable to the tunneling of charge carriers through the center regions. As a result of the special geometric design of semiconductor diodes in accordance with the invention, in particular, as a result of the length d of the intrinsic region 5, according to which the distance between the doped regions 3 and 4 is determined, the threshold voltage of semiconductor diodes in accordance with the invention can be varied. The smaller the region 5 is, in fact, the smaller the external voltage needed to produce a tunnellng of charge carriers through the intrinsic region 5.

Semiconductor diodes in accordance with the invention are not limited to the particular shape shown in FIGS. 1 and 2; they can instead be manufactured in any desired suitable geometry, for example, as symmetrical circular diodes.

Diodes in accordance with the invention are particulary suited, for example, be as protective diodes with, for example, gallium arsenide components, in particular, gallium arsenide field-effect transistors. In such a case the semiconductor diode 1 would be connected as a protective diode between a gate and a source or ground.

The diode according to the invention is, however, also suited for all applications at prescribed threshold voltage values, particularly low voltage values. It is also especially well-suited for use as a delay diode or a clamping diode in connection with bipolar transistors, specifically, to increase their switching speed.

An additional advantage of a semiconductor diode in accordance with the invention is that it is designed as a planar component and is therefore also suitable for integration with compound semiconductors, for example, gallium arsenide semiconductors.

Figure 4:
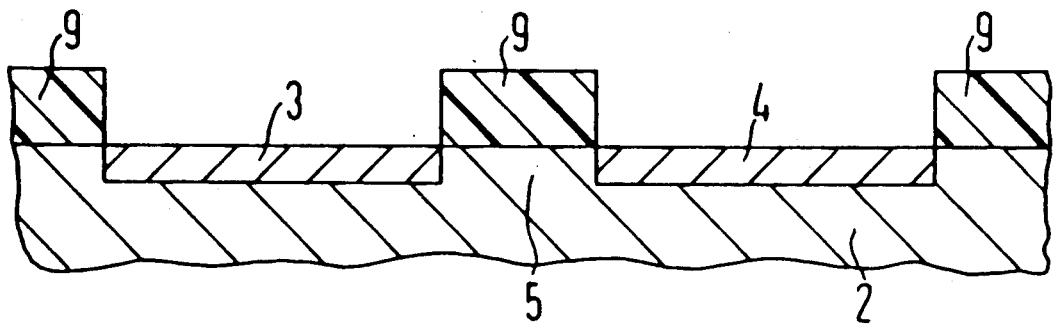
FIGS. 4 and 6 show steps of a preferred embodiment of a process aspect of the invention.
Figure 5:
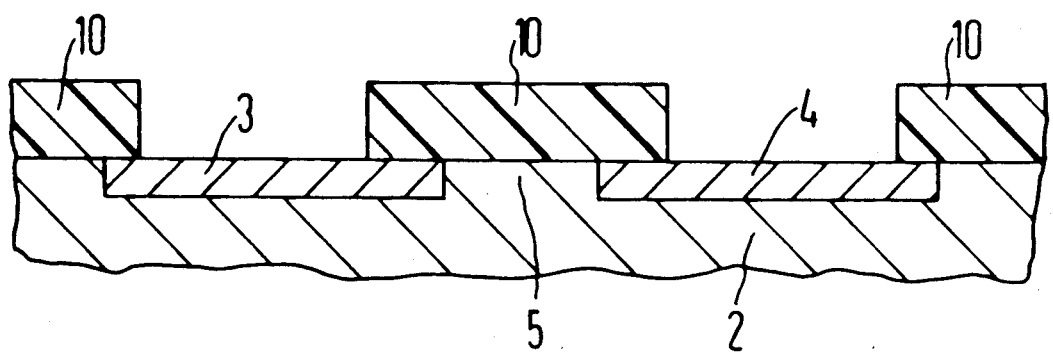
Figure 6:
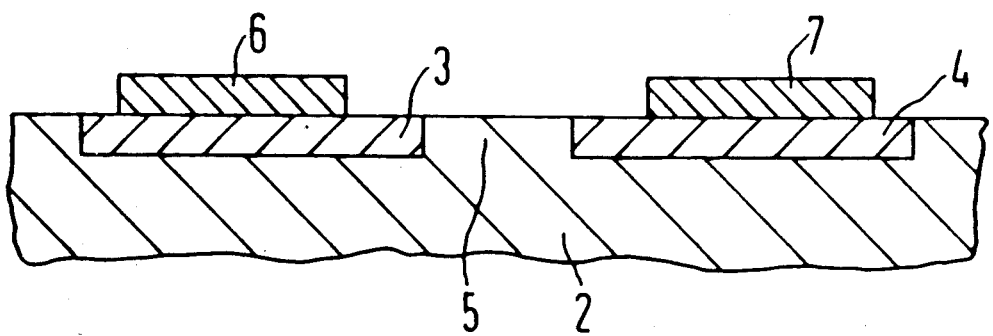

FIGS. 4 to 6 illustrate process steps in the manufacture of a semiconductor diode in accordance with the invention, such as that shown in FIGS. 1 and 2.

FIG. 4 shows a cross-section of a portion of a semiconductor substrate 2, which might be made of a semi-insulating material, which might consist of binary, ternary or guaternary compound semiconductors, in particular of gallium arsenide, indium phosphide Z0 or gallium aluminum arsenide. The semiconductor substrate 2 may be also intrinsic. In order to form the doped regions 3, 4 in the substrate, the substrate 2 is provided with a first photo-resist patterned mask 9. The first photo-resist mask 9 has openings at precisely those places at which the doped regions 3 and 4 are to be formed.

By means of diffusion or implantation, the doped regions 3 and 4 are introduced in the substrate 2 at the places corresponding to the openings in the first photo-resist mask 9. In particular, n-doped regions 3 and 4 are introduced in the substrate. If the doped regions 3 and 4 are intended to have the same type of doping, but different doping concentrations, then an additional photolithographic masking process step must be performed prior to the process step illustrated in FIG. 4, which first covers that one of the doped regions 3 and 4 having the lower doping concentration and exposes only that region that is to have the higher doping concentration or vice versa. If the doping is done by implantation, then an annealing step is to be performed after the implantation steps. A suitable annealing step might be carried out at 840° C. and for 20 minutes.

FIG. 5 shows the same portion of the semiconductor chip illustrated in ig. 4, from which the first photo-resist mask 9 has been removed and on which a second photo-resist mask l, which has openings for the ohmic contacts 6 and 7 that are to be applied, has been placed. In the opening of the second photo-resist mask 10, the ohmic contacts 6 and 7 are aoplied, as by vapor deposition.

FIG. 6 shows the same portion of a semiconductor chip as that illustrated in FIGS. 4 and 5, from which the second photo-resist mask 10 has been removed, by delamination also called lift-off or some other process, and to which ohmic contacts 6 and 7 have been applied. The ohmic contacts 6 and 7 are preferably made on a germanium-gold base and can be made, in particular, in a series of layers including of germanium, gold, chromium, and gold or a series of layers including germanium, gold, nickel and gold.

The center region 5 is located between the doped regions 3 and 4. The center region 5 either exists as such from the outset, if the semiconductor substrate 2 is intrinsic or, when the semiconductor substrate 2 is nonintrinsic, it is compensated 5 suitable doping. The semiconductor substrate usually consists of semi-insulating material and may have a resistance at room temperature of $10^4$ ohm.cm.

Instead of the process described in FIGS. 4 to 6, it is also possible to deposit a continuous, epitaxially applied layer, especially an n− or n+-doped layer, to an intrinsic semiconduc or substrate 2. Using a photo-resist mask that corresponds to a negative of the photo-resist mask 9 shown in FIG. 4, the n− or n+-doped layer is etched down to the substrate surface 2. As a result an intrinsic region 5 is produced again between the doped regions 3 and 4. To apply the ohmic contacts 6 and 7, the process illustrated in FIGS. 5 and 6 can be used.

Those skilled in the art will understand that changes can be made in the preferred embodiments here described, and that these embodiments can be used for other purposes. Such changes and uses are within the scope of the invention, which is limited only by the claims which follow.

What is claimed is:

1. In a process for making a protective device in a semiconductor substrate having at least a semi-insulating surface region for protecting at least one semiconductor device located in the substrate and subject to potentially harmful voltages, the process comprising the steps of:
   epitaxially applying a doped semiconductor layer on the entire surface region;
   structuring the semiconductor layer photolithographically to form two doped regions separated by a third region wherein the semiconductor layer is fully removed to expose the semi-insulating surface in the third region;
   depositing ohmic contacts on the two regions;
   alloying the ohmic contacts;
   passivating the surface region; and
   connecting the ohmic contacts to the one semiconductor device for dissipating the harmful voltages.

2. In a process for making a protective device in a semiconductor substrate having at least a semi-insulating surface region for protecting at least one semiconductor device located in the substrate and subject to potentially harmful voltages, the process comprising the steps of:
   forming a doped semiconductor layer to cover the semi-insulating surface region completely;
   forming an intrinsic conductivity region between two regions of the doped semiconductor layer by insulation-implanatation.
   depositing ohmic contacts on the two regions;
   alloying the ohmic contacts;
   passivating the surface region; and
   connecting the ohmic contacts to the one semiconductor device for dissipating the harmful voltages.

* * * * *